United States Patent
Abdo et al.

(10) Patent No.: US 9,405,186 B1
(45) Date of Patent: Aug. 2, 2016

(54) SAMPLE PLAN CREATION FOR OPTICAL PROXIMITY CORRECTION WITH MINIMAL NUMBER OF CLIPS

(71) Applicant: GLOBALFOUNDRIES INC., Grand Cayman (KY)

(72) Inventors: Amr Y. Abdo, Wappingers Falls, NY (US); Nathalie Casati, Adliswil (CH); Maria Gabrani, Thalwil (CH); James M. Oberschmidt, Stanfordville, NY (US); Ramya Viswanathan, Austin, TX (US); Josef S. Watts, South Burlington, VT (US)

(73) Assignee: GlobalFoundries, Inc., Grand Cayman (KY)

( * ) Notice: Subject to any disclaimer, the term of this patent is extended or adjusted under 35 U.S.C. 154(b) by 0 days.

(21) Appl. No.: 14/628,446

(22) Filed: Feb. 23, 2015

(51) Int. Cl.
*G06F 17/50* (2006.01)
*G03F 1/36* (2012.01)

(52) U.S. Cl.
CPC .............. *G03F 1/36* (2013.01); *G06F 17/5081* (2013.01)

(58) Field of Classification Search
CPC ....................................................... G03F 1/144
USPC ........................................................... 716/53
See application file for complete search history.

(56) References Cited

U.S. PATENT DOCUMENTS

| | | | |
|---|---|---|---|
| 8,363,922 B2 | 1/2013 | Gabrani et al. | |
| 8,661,370 B2 | 2/2014 | DeMaris et al. | |
| 8,667,427 B2 | 3/2014 | DeMaris et al. | |
| 8,751,980 B2 | 6/2014 | Casati et al. | |
| 2006/0161452 A1* | 7/2006 | Hess | G03F 1/144 716/55 |
| 2010/0002706 A1 | 1/2010 | Tochio | |
| 2010/0005440 A1* | 1/2010 | Viswanathan | G03F 1/14 716/53 |
| 2011/0099526 A1* | 4/2011 | Liu | G03F 1/144 716/54 |
| 2012/0110522 A1 | 5/2012 | Bailey et al. | |
| 2015/0052493 A1 | 2/2015 | Ho et al. | |

* cited by examiner

*Primary Examiner* — Suresh Memula
(74) *Attorney, Agent, or Firm* — Yuanmin Cai; Hoffman Warnick LLC

(57) ABSTRACT

Methods, program products, and systems for improving optical proximity correction (OPC) calibration, and automatically determining a minimal number of clips, are disclosed. The method can include using a computing device to perform actions including: calculating a total relevancy score for a projected sample plan including a candidate clip, and wherein the relevancy score is derived from at least one relevancy criterion and a relevancy weight; calculating a relevancy score for the candidate clip, the relevancy score for the candidate clip being a contribution from the candidate clip to the total relevancy score; and adding the candidate clip to a sample plan for the IC layout and removing the candidate clip from the plurality of clips in response a difference in relevancy score between the projected sample plan and one or more previous sample plans substantially fitting a non-linear relevancy score function.

20 Claims, 9 Drawing Sheets

SAMPLE PLAN CREATION FOR OPTICAL PROXIMITY CORRECTION WITH MINIMAL NUMBER OF CLIPS

BACKGROUND

The present disclosure relates generally to improving the efficiency of a computer system for performing optical proximity correction (OPC). To improve the efficiency of a computer system for OPC, embodiments of the present disclosure can automatically create a minimal (i.e., lowest acceptable) size sample plan for optical proximity correction from an integrated circuit (IC) layout. The created sample plan may be composed of one or more portions of the IC layout known as "clips." More specifically, the present disclosure relates to methods, program products, and systems which can create a sample plan based on whether a projected sample plan with a candidate clip would provide significant additional relevancy and coverage of the sampled IC layout.

As IC components have continued to decrease in size, improvements to scale have spawned design implementation issues for some types of features, e.g., in CMOS ICs with features sized less than approximately twenty-two nanometers (nm). As IC technology continues to shrink, the growing need for empirical data from a design may exacerbate the uncertainty of the manufacturing process, thereby increasing the risk of defects or impaired operability. Conventional approaches for traversing physical limits may apply manual or computer-implemented techniques for increasing the resolution of chips printed using optical lithography. One such technique is known as optical proximity correction (OPC). OPC is a computational method for correcting irregularities and distortions arising from diffraction effects by the transforming of mask geometries.

Conventional OPC approaches can use empirical approximation models, which must be calibrated by fitting the model to an existing group of portions within an IC layout, also known as clips. This group of clips can be known as a sample plan. Conventionally, the clips of the sample plan are chosen by application of several constraints, including aerial image-based constraints known as image parameters, which may define a minimum intensity, a maximum intensity, a slope, and a curvature, or a critical dimension (CD), such as the minimum space between printed shapes or width of a printable shape.

The quality of OPC modeling may depend on a user's success in selecting a sample plan from hundreds of thousands of clips, and compiling the sample plan as a test mask layout. Experts typically calibrate conventional OPC models. These experts can calibrate each model by choosing or adjusting the contents of the sample plan based on previous implementations and empirical data relevant to the present sample plan. However, this process greatly increases in complexity as advances in lithography demand smaller transistor sizes. In addition, pressure to deliver a product within time constraints may prohibit the manual building or adjusting of a sample plan. Existing automatic or semiautomatic approaches to select a sample plan are generally limited to selecting a small sample from a very large initial set of clips and/or manually defining at least a minimal size (i.e., number of clips) in a sample plan for a particular IC layout.

SUMMARY

A first aspect of the present disclosure provides a computer-implemented method for automatically creating a sample plan for optical proximity correction (OPC) calibration with a minimal number of clips, the method comprising using a computing device to perform actions including: defining a sample plan including a plurality of clips, each of the plurality of clips representing portions of an integrated circuit (IC) layout; calculating a total relevancy score of a projected sample plan for the IC layout, wherein the projected sample plan includes a candidate clip representing an additional portion of the IC layout, and wherein the relevancy score is derived from at least one relevancy criterion and a relevancy weight for the at least one relevancy criterion, the at least one relevancy criterion being one of a topology type of a clip, a printing difficulty of a clip, and a dimensional ratio between clips in the projected sample plan; calculating a relevancy score difference between the total relevancy score of the projected sample plan and a total relevancy score of the sample plan without the candidate clip; adding the candidate clip to the sample plan for the IC layout and removing the candidate clip from the plurality of clips in response to the relevancy score difference substantially fitting a non-linear relevancy score function; removing the candidate clip from the plurality of clips without adding the clip to the sample plan for the IC layout in response to the relevancy score difference substantially fitting a linear relevancy score function, wherein the candidate clip not being added to the sample plan indicates that the sample plan includes the minimal number of clips; and generating an OPC model using the sample plan with the minimal number of clips, wherein the sample plan with the minimal number of clips represents the target sample plan, and wherein the OPC model is used to manufacture at least one IC.

A second aspect of the present disclosure provides a program product stored on a computer readable storage medium, the program product operative to automatically create a sample plan for optical proximity correction (OPC) calibration with a minimal number of clips when executed, the computer readable storage medium comprising program code for: defining a sample plan including a plurality of clips, each of the plurality of clips representing portions of an integrated circuit (IC) layout; calculating a total relevancy score of a projected sample plan for the IC layout, wherein the projected sample plan includes a candidate clip representing an additional portion of the IC layout, and wherein the relevancy score is derived from at least one relevancy criterion and a relevancy weight for the at least one relevancy criterion, the at least one relevancy criterion being one of a topology type of a clip, a printing difficulty of a clip, and a dimensional ratio between clips in the projected sample plan; calculating a relevancy score difference between the total relevancy score of the projected sample plan and a total relevancy score of the sample plan without the candidate clip; adding the candidate clip to the sample plan for the IC layout and removing the candidate clip from the plurality of clips in response to the relevancy score difference substantially fitting a non-linear relevancy score function removing the candidate clip from the plurality of clips without adding the clip to the sample plan for the IC layout in response to the relevancy score difference substantially fitting a linear relevancy score function, wherein the candidate clip not being added to the sample plan indicates that the sample plan includes the minimal number of clips; and generating an OPC model using the sample plan with the minimal number of clips, wherein the sample plan with the minimal number of clips represents the target sample plan, and wherein the OPC model is used to manufacture at least one IC.

A third aspect of the present disclosure provides a system automatically creating a sample plan for optical proximity correction (OPC) calibration with a minimal number of clips, the system comprising: a computing device configured to perform actions including: defining a sample plan including a plurality of clips, each of the plurality of clips representing portions of an integrated circuit (IC) layout, calculating a total relevancy score of a projected sample plan for the IC layout, wherein the projected sample plan includes a candidate clip representing an additional portion of the IC layout, and wherein the relevancy score is derived from at least one relevancy criterion and a relevancy weight for the at least one relevancy criterion, the at least one relevancy criterion being one of a topology type of a clip, a printing difficulty of a clip, and a dimensional ratio between clips in the projected sample plan, adding the candidate clip to the sample plan for the IC layout and removing the candidate clip from the plurality of clips in response to the relevancy score difference substantially fitting a non-linear relevancy score function, and removing the candidate clip from the plurality of clips without adding the clip to the sample plan for the IC layout in response to the relevancy score difference substantially fitting a linear relevancy score function, wherein the candidate clip not being added to the sample plan indicates that the sample plan includes the minimal number of clips; and an OPC modeling device for generating an OPC model using the sample plan with the minimal number of clips, wherein the sample plan with the minimal number of clips represents the target sample plan, and wherein the OPC model is used to manufacture at least one IC.

BRIEF DESCRIPTION OF THE SEVERAL VIEWS OF THE DRAWINGS

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
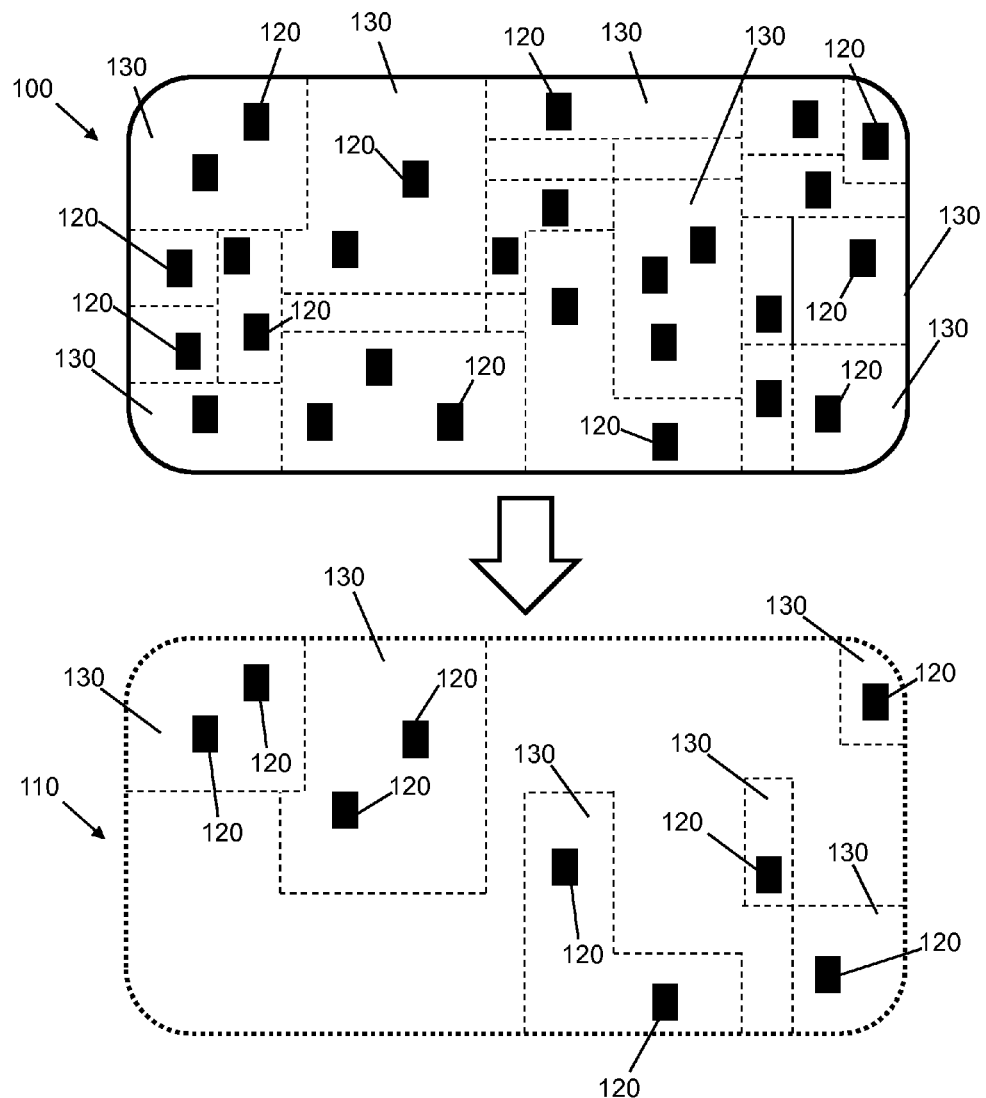
FIG. 1 illustrates an IC layout and an example sample plan according to embodiments of the present disclosure.

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

INTRODUCTION AND GENERAL DEFINITIONS

Embodiments of the present invention are directed toward techniques for creating a sample plan for optical proximity correction (OPC) from an integrated circuit (IC) layout. Embodiments of the present disclosure provide for the automatic sizing of a sample plan and the automatic selection of portions of the IC layout, known as "clips," to be included in the created sample plan. Embodiments of the present disclosure can base the inclusion or exclusion of particular clips in/from the sample plan on one or more relevancy criteria for the sample plan, expressed as a "relevancy score," in addition to the amount by which each clip contributes to the relevancy score of the sample plan when included, relative to the contribution of other clips included within the sample plan. The embodiments discussed herein can provide processes for automatically selecting a minimal number of clips to include within the sample plan (i.e., creating a target sample plan) which retains adequate coverage while reducing the time needed to determine the size of a sample plan.

In an example embodiment, a method according to the present disclosure can include selecting a candidate clip from a group of clips not currently included within the sample plan. The candidate clip can be defined as one or more clips which are proposed to be added to the sample plan. The method can then include creating a projected sample plan which includes the candidate clip, and then calculating a total relevancy score for projected sample plan with the candidate clip included. The total relevancy score for the projected sample plan can be a weighted sum, average, or other representative quantity based on multiple characteristics known as "relevancy criteria" which reflect the total coverage of the sample plan relative to the complete IC layout. Example relevancy criteria can include topology classifications (i.e., the relationship between features in a clip and their ability to be processed by photolithography), printing difficulty of clips in the projected sample plan, and/or dimensional ratios between the clips in the projected sample plan. Each relevancy criterion can be multiplied by a relevancy weight (mathematically represented as a fraction of one), reflecting the criterion's relative importance to characterizing the clip. For example, in an IC layout where some clips are much more difficult to print than others, clips with a higher printing difficulty may be given a greater relevancy weight than in other implementations of the present disclosure.

After calculating a relevancy score for one or more clips in the group, the method includes calculating a difference between the total relevancy score of the projected sample plan (i.e., including the candidate clip) and the total relevancy score of the sample plan without the candidate clip. Embodiments of the present disclosure can compute this difference, e.g., by comparing the total relevancy score of the projected sample plan with a total relevancy score of a sample plan which does not include the candidate clip. The calculated difference can then be compared to linear and non-linear relevancy score functions for the sample plan. Where the calculated difference substantially fits a non-linear score function (i.e., contributions to the total relevancy score continue to diminish), the candidate clip can be removed from the group of clips and added to the sample plan. Where calculated difference substantially fits a linear score function (i.e., contributions to the total relevancy score have stopped diminishing). As used herein, a "removed" clip(s) has been previously used as one candidate clip, and either added to the sample plan or not added to the sample plan. The process can repeat successively for the next clips selected until the contribution to the total relevancy score ceases to substantially fit a non-linear relevancy score function (i.e., no longer substantially fits a submodular set function). In other words, the relevancy score function becoming linear can indicate that a minimal number of clips have been added to the sample plan (i.e., the sample plan has become a target sample plan), and adding more clips to the sample plan would not increase the degree to which the sample plan represents an IC layout.

Conversion of IC Layouts into Sample Plans

FIG. 1 provides a diagram illustrating an IC layout 100 for creating a sample plan 110. Embodiments of the present disclosure can include methods, such as computer-implemented methods and/or program products, and/or systems configured to carry out the process steps described herein. As used herein, the term "system" can refer to a computer system, server, etc. composed wholly or partially of hardware and/or software components, one or more instances of a system embodied in software and accessible a local or remote user, all or part of one or more systems in a cloud computing environment, one or more physical and/or virtual machines accessed via the internet, other types of physical or virtual computing devices, and/or components thereof. The term "IC layout" can refer to a complete or partial IC chip which includes multiple circuit features ("features") 120. The various features 120 can be grouped together into portions of the IC layout, and each portion can be known as a clip 130. Each clip 130 may include features 120 which are interrelated and/or designed to be manufactured together. A "sample plan" refers to a subset of clips 130 of IC layout 100, which are used as a source of empirical data for use with a model during the process of optical proximity correction ("OPC"). In FIG. 1, each clip 130 is shown to be of a different size by way of example only. It is understood that each clip 130 in sample plan 110 may be of the same size and shape (i.e., each shape may be rectangular). The size and shape of clips 130 can also differ from one sample plan 110 to another, e.g., one sample plan 110 can have clips 130 with a uniform size, while another sample plan 110 can have clips 130 with a different uniform size. As shown in FIG. 1 by example, sample plan 110 includes only a select group of clips 130 and features 120, which may provide a group of empirical data for OPC. The effectiveness of sample plan 110 for OPC may depend wholly or partially by the degree to which clips 130 in sample plan 110 represent IC layout 100. As each clip 130 may include one or more features 120, clips 130 and features 120 are identified and referenced collectively as clips 130.

Converting IC layout 100 into sample plan 110 can present trade-offs and related technical challenges. In practice, IC layout 100 may include, e.g., thousands of clips 130 which together may represent millions of distinct features 120. Including every feature 120 and clip 130 of IC layout 100 in sample plan 110 may be prohibitively time consuming and expensive and may cause OPC to become excessively difficult for some IC layouts 100. However, including too few features 120 and clips 130 in sample plan 110 may impair the accuracy and usefulness of sample plan 110 during the application of OPC. Inventive aspects of the present disclosure relate to the criteria by which some clips 130 and their corresponding features 120 are prioritized over others for inclusion within sample plan 110. Specifically, aspects of the present disclosure can assign a generalized "relevancy score" to a projected sample plan based on one or more specific relevancy criteria. Each relevancy criterion can be correlated with a relevancy weight, based on the criterion's importance or contribution to sample plan 110. Embodiments of the present disclosure can also calculate a difference in total relevancy score between a projected sample plan, including a specific candidate clip, and sample plan 110 without the candidate clip to determine whether the candidate clip can be added to sample plan 110. In addition, aspects of the present disclosure can provide a sub-optimization technique, based on relevancy scores, to determine the smallest number of clips 130 added to sample plan 110 before successive clips cease to follow a non-linear relevancy score profile. The minimum relevancy score for sample plan 110 can be known as a target relevancy score, and can be the relevancy score of another sample plan 110, which may be created from a different IC layout 100.

To provide these advantages, embodiments of the present disclosure can apply a mathematical summing property known as diminishing returns. Diminishing returns, generally applicable to a type of mathematical model known as a submodular set functions, is a mathematical situation for summing operations where an additive series ranked from highest value to lowest value will approximately converge towards (i.e., become nearly equal to) the total sum of the series before all values in the series are included. Embodiments of the present disclosure characterize the total relevancy score for successive projected sample plans with increasing numbers of clips 130 as converging to the total relevancy score of a sample plan which includes every clip 130 of IC layout 100. Steps according to the present disclosure determine a minimal number of clips 130 needed for the total relevancy score to approximate a relevancy score for a target sample plan. In contrast to conventional approaches, which may be limited to characterizing each clip 130 strictly by image parameters, relevancy scores for each projected sample plan can be based on one or more other types of criteria such as orders of diffraction (i.e., clip diversity), printing difficulty, and/or dimensional ratios, as alternatives or additions to image parameters.

Figure 2:
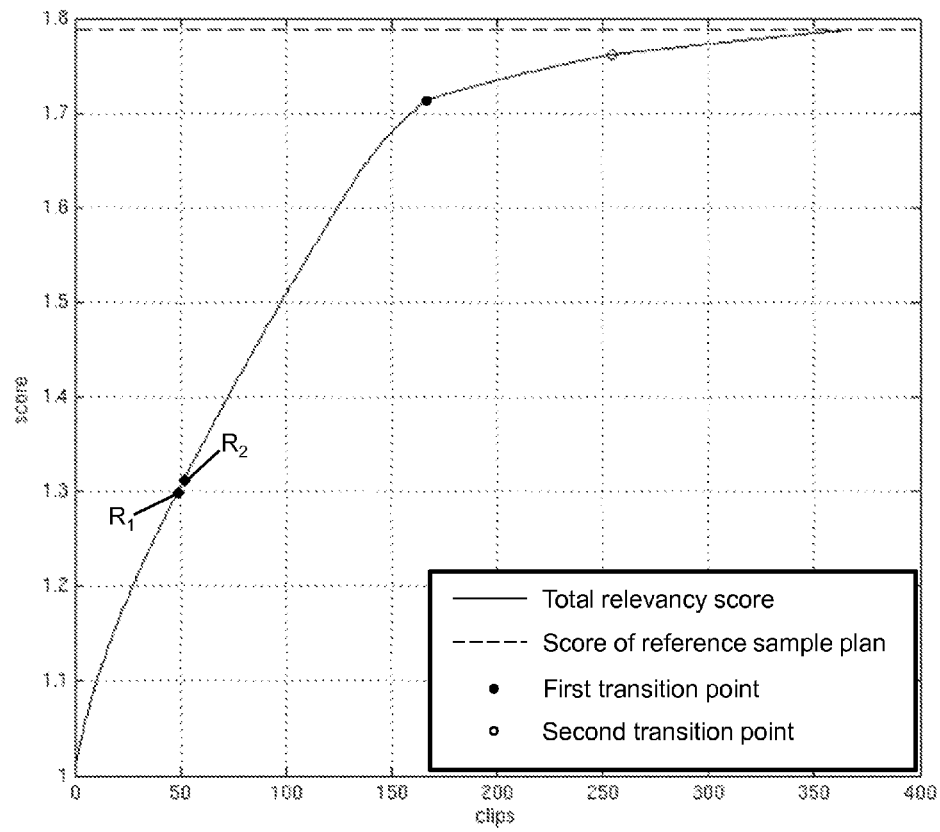
FIG. 2 provides an illustrative plot of relevancy scores versus number of clips within a sample plan according to embodiments of the present disclosure.

FIG. 2 provides a plot of relevancy score versus number of clips for an example IC layout 100 (FIG. 1) according to embodiments of the present disclosure. A reference sample plan 110 plotted in FIG. 2 reaches a target relevancy score when approximately three hundred and seventy clips are included. The target relevancy score, illustrated as a hashed line in FIG. 2, can be derived from one or more existing sample plans 110 created from the same IC layout 100 or different IC layouts 100. In addition or alternatively, the target relevancy score can be the total relevancy score of sample plan 110 with a set of critical clips included. Further explanation of the methods, systems, and program products discussed herein will be discussed relative to the example plot of FIG. 2, but it is understood that embodiments of the present disclosure can be applicable to creating sample plans 110 (FIG. 1) from IC layouts 100 with different numbers of clips 130 (FIG. 1). The solid line in FIG. 2 represents the total relevancy score of sample plans 110 which include a particular number of clips 130 (i.e., projected sample plans 234 discussed elsewhere herein), while the hashed line in FIG. 2 represents the target relevancy score for created sample plan(s) 110. In FIG. 2, each sample plan 110 may be assigned a relevancy score between zero and one based on relevancy criteria such as diversity, aerial-image quality, printing difficulty, and dimensional ratio. Each clip 130 added to sample plan 110 can increase the total relevancy score of sample plan 110.

Two transition points appear in the plot of FIG. 2. The term "transition point" can refer to a point on a plot of relevancy score versus number of clips where the marginal contribution to relevancy for each successive clip changes from one type of relevancy score function to another. In FIG. 2, first and second transition points occur at total relevancy scores of approximately 1.72 and 1.77, and the target relevancy score is approximately 1.80. In this example, sample plan 110 at the first transition point covers slightly above ninety-five percent of the target relevancy score by including approximately one-hundred and sixty five clips 130 in sample plan 110. Between zero clips and the first transition point, the relevancy score function can be non-linear, e.g., by taking on an exponential curve. Further, sample plan 110 covers approximately ninety-eight percent of the target relevancy score by including approximately two-hundred and sixty clips out of approximately three-hundred and seventy clips, at the second transition point. Between the first and second transition points, the relevancy score function for sample plan 110 can also be exponential, and can exhibit a different degree of curvature. Both exponential curves of FIG. 2 are shown to provide diminishing contributions to relevancy score for each clip added to sample plan 110. Embodiments of the present disclosure can identify transition points in of a plot of relevancy score versus number of clips by comparing the total relevancy score of sample plan 110 and the contribution from a candidate clip to non-linear and linear relevancy score function. As shown in FIG. 2, the relevancy score function for sample plan 110 can become linear after the second transition point. The identified transition points correspond to an approximate number of clips 130 which allow sample plan 110 to approximate the target score to a particular degree of accuracy.

Computer System and Example Components

Figure 3:
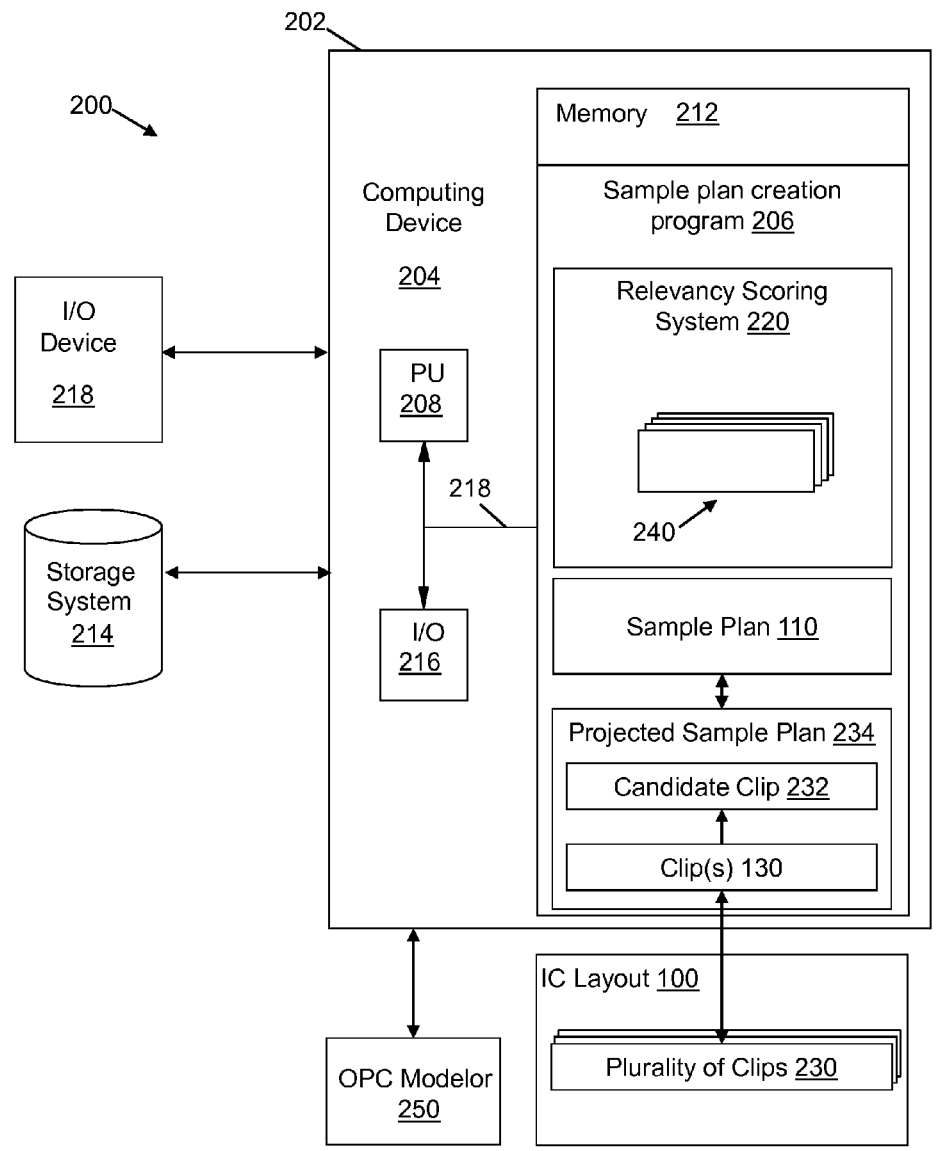
FIG. 3 depicts an illustrative environment which includes a computer system interacting with an IC layout according to embodiments of the present disclosure.

Turning now to FIG. 3, an illustrative environment 200 for implementing the methods and/or systems described herein is shown. In particular, a computer system 202 is shown as including a computing device 204. Computing device 204 can include a sample plan creation program 206 which creates sample plans for OPC of a particular size by performing any/all of the processes described herein and implementing any/all of the embodiments described herein.

Computer system 202 is shown including a processing unit 208 (e.g., one or more processors), an I/O component 210, a memory 212 (e.g., a storage hierarchy), an external storage system 214, an input/output (I/O) device 216 (e.g., one or more I/O interfaces and/or devices), and a communications pathway 218. In general, processing unit 208 can execute program code, such as sample plan creation program 206, which is at least partially fixed in memory 212. While executing program code, processing unit 208 can process data, which can result in reading and/or writing transformed data from/to memory 212 and/or I/O device 216. Pathway 218 provides a communications link between each of the components in environment 200. I/O component 210 can comprise one or more human I/O devices, which enable a human user to interact with computer system 202 and/or one or more communications devices to enable a system user to communicate with the computer system 202 using any type of communications link. To this extent, sample plan creation program 206 can manage a set of interfaces (e.g., graphical user interface(s), application program interface(s), etc.) that enable system users to interact with sample plan creation program 206. Further, sample plan creation program 206 can manage (e.g., store, retrieve, create, manipulate, organize, present, etc.) data, through several modules 240 contained within a relevancy scoring system 220.

Further, sample plan creation program 206 can include a relevancy scoring system 220. In this case, various modules of relevancy scoring system 220 can enable computer system 202 to perform a set of tasks used by sample plan creation program 206, and can be separately developed and/or implemented apart from other portions of sample plan creation program 206. Sample plan creation program 206 can also include sample plan 110 stored therewith. IC layout 100 can be divided into a plurality of clips 230. One of the plurality of clips 230 of IC layout 100 can be selected as a candidate clip 232. Candidate clip 232 can be added to a projected sample plan 234, in addition to any other clips 130 previously selected for inclusion in sample plan 110. Relevancy scoring system 220 can perform processes discussed herein to determine whether projected sample plan 234 can be created as a new sample plan 110, including candidate clip 232 and any other clips 130 previously added to sample plan 110. Process steps for assigning relevancy scores to candidate clip 232 and projected sample plan 234, and creating sample plan(s) 110 based on these scores, are discussed in detail elsewhere herein.

Memory 212 can include various software modules 240 configured to perform different actions. Example modules can include, e.g., a comparator, a calculator, a clip sorter and/or extractor, etc. One or more modules 240 can use algorithm-based calculations, look up tables, software code, and/or similar tools stored in memory 212 for processing, analyzing, and operating on data to perform their respective functions. Each module discussed herein can obtain and/or operate on data from exterior components, units, systems, etc., or from memory 212 of computing device 204. Relevancy scoring system 220 of sample plan creation program 206 can assist in creating sample plan 110 for OPC from IC layout 100 according to embodiments discussed herein. Plurality of clips 230 may represent distinct portions of IC layout 100. One or more candidate clips 232 can be selected from plurality of clips 230. As used herein, the term "candidate clip" can refer to any clip 130 from IC layout 100 which has not been previously considered for inclusion within sample plan 110. Some attributes of candidate clip 232 can be converted into a data representation (e.g., a data matrix with several values corresponding to particular attributes) and stored electronically, e.g., within memory 212 of computing device 204, storage system 214, and/or any other type of data cache in communication with computing device 204. As discussed elsewhere herein, each candidate clip 232 can be removed from plurality of clips 230 (e.g., by being flagged, marked-off, etc.) after being used in projected sample plan(s) 234. Candidate clip 232 can additionally or alternatively be converted into data inputs or other inputs to sample plan creation program 206 with various scanning or extracting devices and/or manual entry of a user, e.g., by determining the dimensions of clip(s) 130, measuring and/or determining topology measures (e.g., a polygon count, area density, and/or diffraction order coefficient), calculating a value of printing difficulty based on the attributes of clip(s) 130, etc.

Computer system 202 can be operatively connected to or otherwise in communication with an OPC modeling device ("OPC modelor") 250. OPC modelor 250 can generate OPC models using, e.g., sample plan creation program 206. OPC models generated with OPC modelor 250, and which include the minimal number of clips, can be transmitted to a fabricating device or system to manufacture ICs. OPC modelor 250 can be one of several devices in a semiconductor manufacturing plant, or can be multiple devices each operatively connected to computer system 202. Embodiments of the present disclosure can include creating sample plan 110 with a minimal number of clips 130 included, generating an OPC model using, e.g., modules 240 of sample plan creation program 206, before using OPC modelor 250 to generate an OPC model.

Where computer system 202 comprises multiple computing devices, each computing device may have only a portion of sample plan creation program 206 and/or relevancy scoring system 220 fixed thereon (e.g., one or more modules). However, it is understood that computer system 202 and sample plan creation program 206 are only representative of various possible equivalent computer systems that may perform a process described herein. Computer system 202 can obtain or provide data, such as data stored in memory 212 or storage system 214, using any solution. For example, computer system 202 can generate and/or be used to generate data from one or more data stores, receive data from another system, send data to another system, etc.

Operational Methodology

Figure 4:
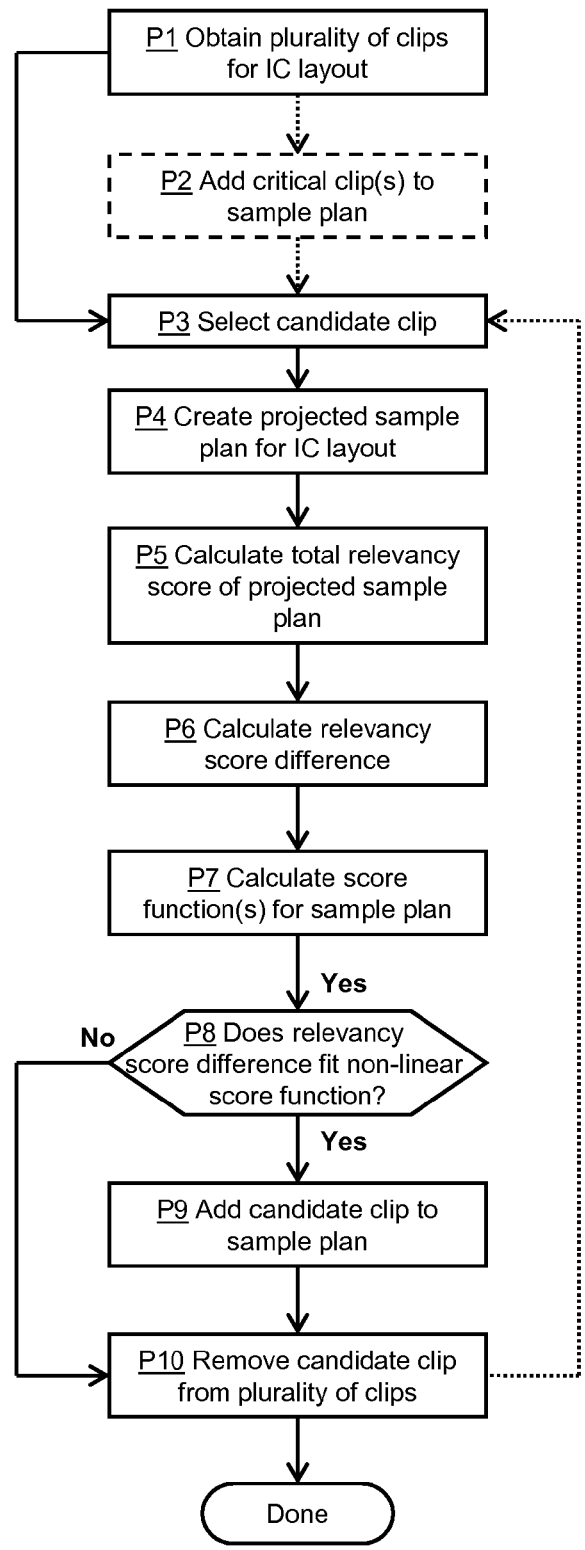
FIG. 4 depicts a flow diagram with illustrative process steps according to embodiments of the present disclosure.

Referring to FIG. 4 in conjunction with FIG. 3, a flow diagram of processes according to the present disclosure is shown. The process flow diagram of FIG. 4 provides an overview of various method steps and processes. The steps and processes can each be carried out with one or more modules 240 of relevancy scoring system 220 and described herein by example. Embodiments of the present disclosure, as illustrated by example in FIG. 4, can create sample plan 110 from plurality of clips 230 based on relevancy scores assigned to each clip 130 according to process steps discussed herein. Using the process steps discussed herein, relevancy scoring system 220 can create sample plans 110 which provide a minimum amount of coverage. In the example method steps discussed herein, sample plan 110 which provides the target score will be described as including a total of three-hundred and seventy clips of a particular IC layout 100 pursuant to the example plot of FIG. 2. However, it is understood that IC layouts 100 for a referenced sample plan 110 and/or used to create new sample plans 110 can have any conceivable number of clips 130 with any conceivable dimensions, number of features, etc., and that other examples are discussed herein where appropriate.

In process P1, modules 240 of relevancy scoring system 220 can obtain a plurality of clips 230 for IC layout 100. Each clip 130 obtained from IC layout 100 can include several IC elements and/or sub-structures, referred to generally as features 120 (FIG. 1). The obtaining of clips 130 can be provided, e.g., by a manual or automatic division of IC layout 100 into clips 130. As discussed elsewhere herein, each clip 130 can be of uniform size and/or shape. IC layout 100 from which clips 130 are obtained in process P1 can represent all of a single IC product and/or a distinct portion of a larger IC product. In any event, the obtaining of clips 130 from IC layout 100 can be automatic based on predetermined criteria defined by sample plan creation program 206 (e.g., receiving a map of clips 130 from an independent system, software program, etc.), can be dictated via user selection, and/or can be selected via rules generated by a system and/or programmed by a user. In any case, each of the plurality of clips 230 in process P1 can be eligible for inclusion within sample plan 110. In the example illustrated in FIG. 2, relevancy scoring system 220 divides IC layout 100 into hundreds of clips measured on x-axis.

The flow can optionally proceed to a process P2, in which modules 240 of relevancy scoring system 220 automatically adds one or more "critical clips" to sample plan 110. One or more clips 130 obtained in process P1 may represent features 120 and/or other portions of IC layout 100 which provide fundamental structures and/or functions. These critical clips can be predefined by a user, independent system or process, or sample plan creation program in an independent process. A user may desire for critical clips to be included in sample plan 110, regardless of their contributions to the total relevancy score of sample plan 110. At process P2, modules 240 of relevancy scoring system 220 can add all critical clips of IC layout 100 to sample plan 110. Where IC layout 100 includes no critical clips, or where no critical clips are designated, the flow can bypass process P2 as shown by the corresponding phantom process flow. In the example illustrated in FIG. 2, no critical clips are designated and process P2 is bypassed.

The flow can proceed to process P3 in which sample plan creation program 206 selects candidate clip 232 from plurality of clips 230. Modules 240 of relevancy scoring system 220 can determine which clip 130 to select as candidate clip 232 based on, e.g., one clip 130 being the next clip 130 in a permuted list, making a random selection from plurality of clips 230, selecting a clip with a highest predicted relevancy, combinations of these techniques, and/or any other currently known or later developed process for selecting one clip 130 from plurality 230. In an alternative embodiment, multiple candidate clips 232 can be selected sequentially or simultaneously. Although candidate clip 232 is referenced in singular terms herein, it is understood that candidate clip 232 can be in the form of multiple candidate clips 232. The flow can proceed to a process P4 in which relevancy scoring system 220 can create projected sample plan 234, which can include candidate clip 232 and other clips previously added to sample plan 110, if any.

Figure 5:
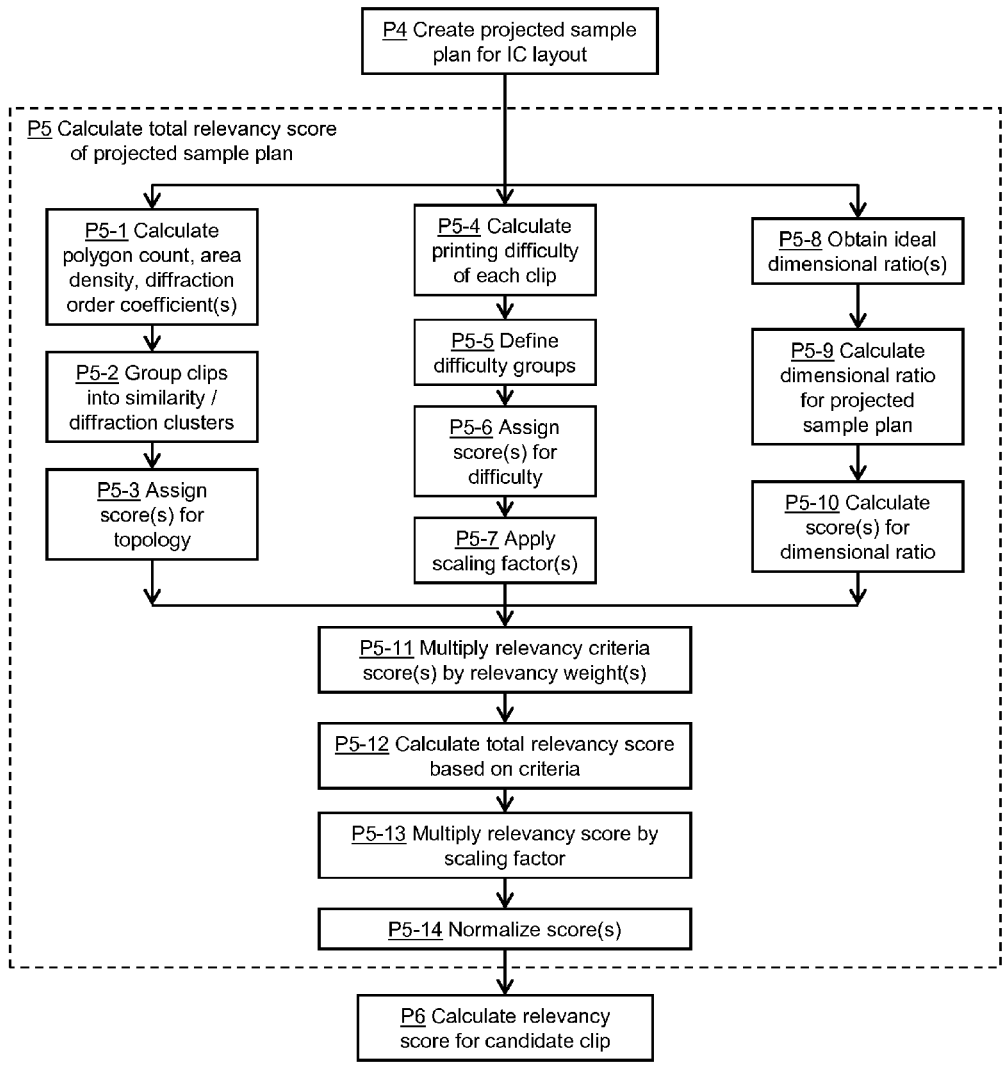
FIG. 5 depicts a flow diagram with an expanded view of process steps and sub-processes according to embodiments of the present disclosure.

At process P5, relevancy scoring system 220 can calculate a total relevancy score for projected sample plan 234. Where critical clips were previously designated in process P2, relevancy scoring system 220 can include these critical clips in the calculated total relevancy score for projected sample plan 234. In alternative embodiments where processes discussed herein occur in a different order, the calculating of relevancy scores for projected sample plan 234 in process P3 may occur before the adding of critical clips to sample plan 110 in process P2. The calculating of relevancy scores in process P5 can include numerous sub-processes performed with different modules of relevancy scoring system 220. An example group of sub-processes for process P5 is shown in FIG. 5 and discussed in further detail elsewhere herein. In any event, the calculated relevancy score for each clip 130 can depend on one or more relevancy criteria.

A first example relevancy criterion can include the "topology type" of candidate clip 232 and each clip 130. Each topology type can represent a group of clips 130 which diffract light similarly to (e.g., within boundaries of light diffraction from an optical light source) other clips of the same topology type. The topology of each clip 130 in sample plan 110 can be measured based on a polygon count, area density, and/or diffraction order coefficient for clips 130. Each clip 130 can be assigned to similarity and diffraction groups based on their polygon counts, area densities, and/or diffraction order coefficients. A polygon count can be calculated as a total number of shapes within each clip 130. An area density can be calculated as a percentage of area (i.e., in two dimensions of space) of the projected sample plan occupied by polygons of each clip 30. A diffraction order coefficient can calculated as a function of the layout mask for IC layout 100 and wavelengths produced by a corresponding light source. The first clip added to projected sample plan 234 can provide the greatest contribution to the total relevancy score for "topology type" for that particular group, with each successive clip 130 of one topology type contributing a lower relevancy score than the clip added to projected sample plan 234 from the same group.

A second example relevancy criterion can include the "printing difficulty" of candidate clip 232 and each clip 130 in projected sample plan 234. The printing difficulty can be any representation, numerical, graphical, or otherwise, of the difficulty for printing clips 130 of IC layout 100. Two example printing difficulty metrics can include: Lithographic Difficulty Estimators (LDE) and the critical dimension. An LDE as used herein, can refer to a multiplying coefficient calculated for a particular clip, which represents process-related factors which can increase the printing difficulty. The LDE can be directly proportional to the critical dimension of the clip. A "critical dimension," as discussed herein, refers to the smallest distance between two features 120 of a particular clip 130, below which features 120 cannot be reliably printed to a wafer or mask. Clips with higher value LDEs and/or smaller critical dimensions in a clip can increase the printing difficulty of the clip.

Similar to topology type, each clip 130 can be assigned to a group representing a particular range of printing difficulties (e.g., easiest difficulty clips, hardest difficulty clips, etc.). The first clip added to projected sample plan 234 can provide the largest contribution to total relevancy score for a particular printing difficulty group, with each successive clip 130 of one printing difficulty contributing a lower relevancy score than the previous clips added to projected sample plan 234 from the same group. Clips 130 with higher printing difficulties may be more relevant to the eventual sample plan 110 than clips 130 of a lower printing difficulty, and modules 240 can optionally apply scaling factors (i.e., multipliers) to emphasize the contribution to relevancy score from clips 130 in higher printing difficulty groups. In an alternative embodiment, each clip 130 can be assigned a scaling factor based on the likelihood of each clip 130 being in a particular printing difficulty group. For example, over half of all clips 130 from IC layout 100 could part of a middle-difficulty group, with a minority of clips belonging to higher and lower printing difficulty groups. Here, a user may desire for over half of clips 130 in sample plan 110 to belong to the middle-difficulty group, and thus may assign higher weights to printing difficulty groups with more clips 130.

A third example relevancy criterion can include the "dimensional ratio" between clips 130 of a particular category, including candidate clip 232, in projected sample plan 234. Alternatively, the dimensional ratio can be calculated as a ratio between clips of 130 of projected sample plan 234 and a different sample plan 110. Design constraints may specify a desired ratio between the total number of clips of a particular type, e.g., the ratios between the total number of one-dimensional ("1D") horizontal, 1D vertical, two-dimensional ("2D") horizontal, and 2D vertical clips in projected sample plan 234. A one dimensional clip generally refers to a clip with either a length or a width which is below a predetermined threshold value. The other clip dimension (length or width) can have any conceivable value. In an example implementation, 1D horizontal clips can have a length below the threshold value, and 1D vertical clips may have a width below the threshold value. Greater accuracy may correspond to one or more of these ratios, where a desired value is specified, being similar to the same ratios in sample plan 110 for IC layout 100. Smaller differences between the dimensional ratios for sample plan 110 and their ideal values can increase the relevancy score for projected sample plan 234 with particular clips 130 being included.

One or more of types of relevancy criteria can contribute to the total relevancy score for projected sample plan 234 with candidate clip 232 included. At process P6, relevancy scoring system 220 can also calculate a difference in total relevancy score between projected sample plan 234, including candidate clip 232, and sample plan 110 without candidate clip 232 being included. Modules 240 of relevancy scoring system 220 can, for example, subtract the total relevancy score of sample plan 110 (without candidate clip 232 included) from the total relevancy score of projected sample plan 234. The difference in total relevancy score can represent the amount by which candidate clip 232 increased the total relevancy score of projected sample plan 234. Referring to the example of FIG. 2, one projected sample plan 234 with forty-nine clips may have a total relevancy score of approximately 1.30 (i.e., at reference position $R_1$), while another projected sample plan 234 with fifty clips can have a total relevancy score of approximately 1.31 (i.e., at reference position $R_2$). Thus, approximately 0.1 of the total relevancy score of projected sample plan 234 between $R_1$ and $R_2$ be contributed from candidate clip 232, and various fractions of this contribution can be provided from respective relevancy criteria.

At process P7, modules 240 with comparing functions can calculate one or more relevancy score functions for sample plan 110. More specifically, modules 240 can model the relationship between the number of clips 130 in sample plan 110 and the total relevancy score of sample plan 110. This relationship can approximately follow, e.g., an exponential distribution based on empirical data, such as clips 130 included in sample plan 110 and the relevancy score functions found in other sample plans 110. A difference between the relevancy score function(s) fit to sample plan 110 and the total relevancy score of sample plan 110 for each respective number of clips 130 can be expressed as a "fitting error." The fitting error can be numerically expressed as a percentage difference between expected total relevancy scores and actual total relevancy scores for sample plan 110 at a particular number of clips 130. In process P7, modules 240 can calculate multiple relevancy score functions for a particular number of clips 130 in sample plan 110, some of which may be exponential (i.e., exhibit diminishing returns), while others may be linear (i.e., each successive clip 130 would contribute substantially the same amount to the total relevancy score of sample plan 110. In the example of FIG. 2, a contribution of 0.1 from candidate clip 232 as the fiftieth clip may be less than the contribution to relevancy score of approximately 0.12 from the forty-ninth clip. Thus, the fiftieth selected clip would continue to follow a non-linear relevancy score function. In contrast, each clip 130 added to sample plan 110 after the second transition point may contribute approximately 0.01 to the total relevancy score of sample plan 110, and thus would substantially fit a linear relevancy score function.

At process P8, modules 240 with comparing functions can compare the relevancy score function for projected sample plan 234 and previous sample plans 110 with fewer clips 130 included with linear and non-linear relevancy score functions. More specifically, modules 240 can determine whether projected sample plan 234 substantially fits (i.e., is within the fitting error) of a non-linear relevancy score function or a linear relevancy score function. The fitting error used in the comparison at process P8 can vary depending on user constraints and proposed implementations, and in an example embodiment can be an error of approximately 95% (i.e., the measured value is no more than approximately five percent different from the expected value). The coverage fitting error between the calculated relevancy score function and the relevancy scores of previous sample plans 110 and projected sample plans 234 in this comparison can be defined by a user and/or independent process. Referring to the example of FIG. 2, a maximum fitting error for the total relevancy score to "substantially fit" a particular relevancy score function could be approximately ninety-five percent or approximately ninety-eight percent of the target relevancy score. In process P8, modules 240 of relevancy scoring system 220 can compare the total relevancy scores of previous sample plans and 110 projected sample plan 234 with linear and non-linear relevancy score functions, e.g., by way of mathematical comparisons. Where the relevancy score plot for projected sample plan 234 and preceding sample plans 110 ceases to substantially fit a non-linear relevancy score function (i.e., "no" at process P8), the flow can proceed to process P10 where modules 240 of relevancy scoring system 220 can remove candidate clip 232 from the plurality of clips 230 without candidate clip 232 being added to sample plan 110. Where the total relevancy score of projected sample plan 234, when added to the plot of relevancy scores for sample plans 110, continues to substantially fit a non-linear relevancy score function (i.e., "yes" at process P8), the flow can proceed to process P9, where relevancy scoring system 220 adds candidate clip 232 to sample plan 110. Where candidate clip 232 is added to sample plan 110 in process P9, modules 240 of relevancy scoring system 220 can then remove candidate clip 232 from plurality of clips 230 in process P10. In the example of FIG. 2, a linear relevancy score function may occur at approximately the second transition point, where the quotient of total relevancy score at the second transition point over target relevancy score is approximately equal to 1.77 divided by 1.80, or approximately ninety eight percent In an embodiment, the process flow can conclude ("done") where only one candidate clip 232 or group of candidate clips 232 is considered for addition to sample plan 110. In alternative embodiments, the process flow can return to process P4 (i.e., along the phantom process flow from process P10 to process P4) where relevancy scoring system 220 selects a new candidate clip 232. The process flow discussed herein can be repeated successively until, e.g., all clips 130 are removed from plurality of clips 230, until the contribution from one or more candidate clips contribute to the total relevancy score of projected sample plan 234 substantially fits a linear relevancy score function (i.e., the contribution to total relevancy score from successive clips ceases to diminish). In the example of FIG. 2, the process flow from processes P3 through P10 repeats approximately two-hundred and fifty-five times until the relevancy score function for sample plan 110 substantially fits a linear relevancy score function at the second transition point.

Detailed Examples of Relevancy Criteria

Referring to FIGS. 3 and 5 together, embodiments of the present disclosure can calculate the total relevancy score of projected sample plan 234 based on one or more of at least four relevancy criteria applied to clips 130 and candidate clip 232. The sub-processes described herein can occur at process P5 where relevancy scoring system 220 can calculate relevancy scores for projected sample plan 234. As is discussed herein, the relevancy score for candidate clip 232 and projected sample plan 234 can be based in part on topology type, printing difficulty, and dimensional ratios. The sub-processes of process P5 can calculate the contributions from one or more relevancy criteria in the alternative, simultaneously, or sequentially.

First Example

Topology Type (Processes P5-1 Through P5-3)

A first example relevancy criterion applied in process P5 can include the topology type. The topology types for clips 130 in IC layout 100 can span a set of known topologies for CMOS technology. Furthermore, the first clip 130 added to sample plan 110 for a particular topology type can have the highest contribution to its relevancy score for this relevancy criteria. Each successive clip 130 from the same topology type can have a lower contribution to relevancy score from topology type. Thus, dividing plurality of clips 230 into different topology types can provide a relevancy scoring approach for creating sample plans 110 which reflect the diversity of clips 130 in IC layout 100 and/or sample plan 110 which provides the target relevancy score.

At process P5-1, modules 240 of relevancy scoring system 220 can calculate one or more topology measurements for clips 130 in projected sample plan 234. For example, modules 240 can calculate a polygon count for IC layout 100. The polygon count can be expressed as a total number of shapes for each clip 130. A "polygon" or "rectilinear polygon" refers to any polygonal shape where all edges of the polygon meet another edge at a right angle (i.e., at approximately ninety degrees relative to each other in a given plane). Modules 240 can also calculate an area density for each IC layout 100. The area density can represent a percentage of area in projected sample plan 232 taken up by polygons in each clip 130. Modules 240 can also calculate several diffraction order coefficients representing the effect on groups of clips 130 from an optical light source. Modules 240 of relevancy scoring system 220 can begin to compute a diffraction order coefficient for each of plurality of clips 230, e.g., by first representing each clip 130 as a plurality of rectilinear polygons. To calculate the value of the diffraction order coefficient, the aerial image of IC layout 100 can be approximated by performing a Fourier Transform upon the rectilinear polygon representation of IC layout 100 and multiplying the transformed representation of IC layout 100 with an optical light source wavelength function (i.e., a mathematical function for determining the wavelength(s) from a light source during processing) for IC layout 100. The various topology measures calculated in process P5-1 may not have significantly greater or lesser relevance to accurately representing IC layout 100 in sample plan 110, but it may be desirable for a particular number of clips 130 from each diffraction order to be included in the created sample plan 110.

In process P5-2, modules 240 can group or cluster each clip 130 in projected sample plan 232 into similarity groups and/or diffraction clusters. Each group or cluster can represent a range of attributes for some clips 130. For example, each "similarity group" can correspond to a predetermined range of polygon counts and area densities, which may be calculated according to need or set manually by a user. Each "diffraction cluster" can correspond to a predetermined range of diffraction order coefficients for each clip 130. In any event, modules 240 can define the ranges for each diffraction cluster and/or similarity group in process P5-2 after computing the approximated aerial representation of IC layout 100, e.g., by applying a "nearest neighbor" sorting algorithm to the group of approximated clips 130. The determination in process P5-2 can be based on identifying the number of polygons and the feature density (i.e., number of features 120 (FIG. 1) in clip 130 divided by a cross-sectional area) of a transformed clip 130 and associating the polygon number and/or feature density of clips 130 or candidate clip 232 with the characteristics of a particular clip topology.

Based on the number of clips 130 in each cluster and/or group, modules 240 in process P5-3 can then assign topology score(s) to each clip 130 in a particular cluster and/or group. In an example embodiment, the scores assigned to each diffraction order can be relative to the number of clips from each diffraction order included in sample plan 110 and/or projected sample plan 234, i.e., the first clip added from a given diffraction cluster may receive a score of 0.05, while the next clip added from the same diffraction cluster may receive a score of 0.025, etc. In the example provided in FIG. 2, the changing relevancy score functions for sample plans 110 after the first and second transition points may represent a situation where clips 130 included in sample plan 110 cover most or all of the similarity groups and/or diffraction clusters. In this manner, the relevancy of clip 130 and/or candidate clip 234 can be quantified based on whether other clips 130 in projected sample plan 234 are obtained from different topology types. Relevancy scoring system 220 can use topology type as a sole relevancy criterion for each candidate clip 232 and projected sample plan 234, or can use topology type in conjunction with other relevancy criteria discussed herein.

Figure 6:
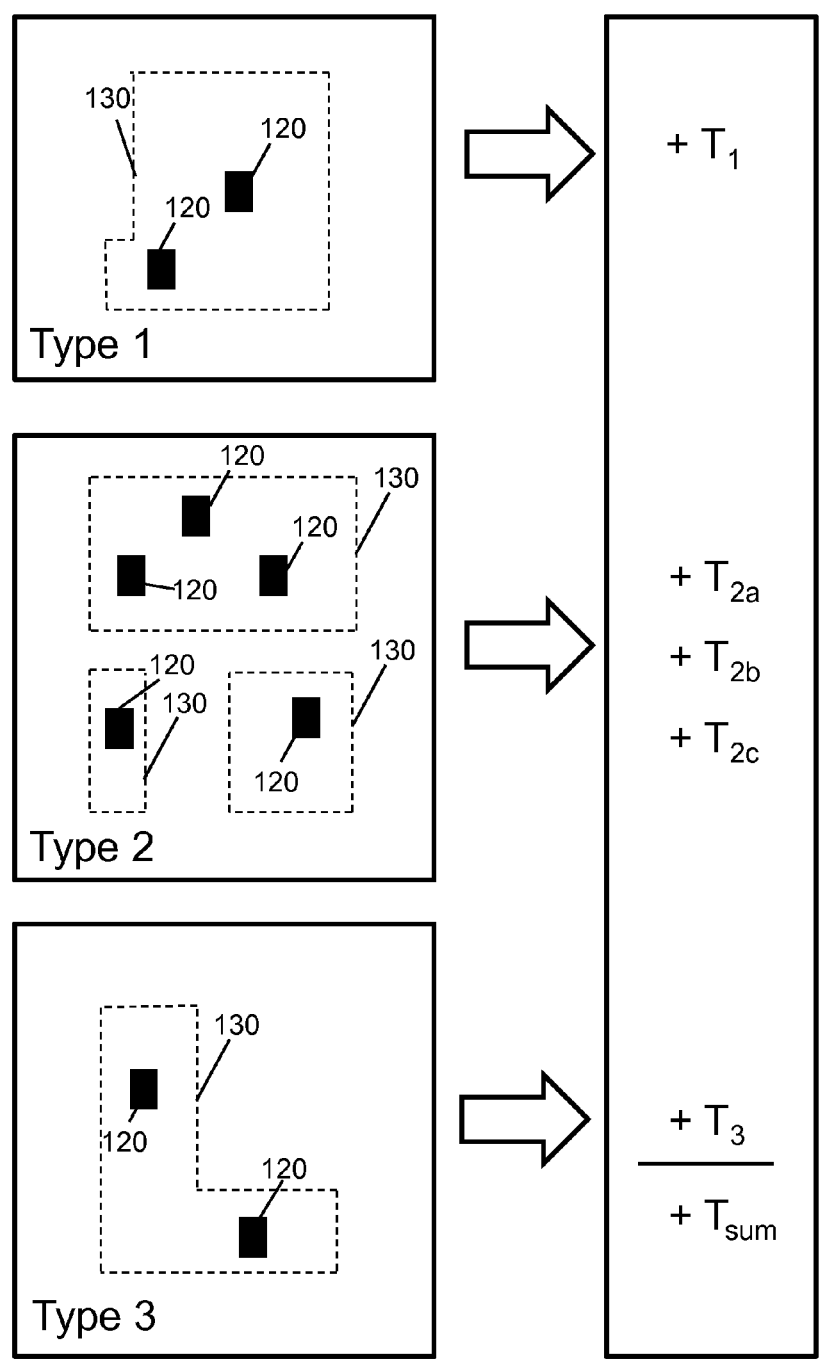
FIG. 6 provides a schematic diagram for calculating a relevancy score based on topology type.

Referring briefly to FIG. 6, a schematic diagram for calculating relevancy score based on topology type is shown. In the example of FIG. 6, multiple clips 130 are divided into three topology types (i.e., similarity groups, diffraction clusters, and/or pairs of similarity and diffraction clusters) based on, e.g., the topology measures for each clip 130 discussed herein. Although each topology type can include any conceivable number of clips 130, the example of FIG. 6 shows one clip 130 in topology types one and three, while three clips 130 are included in topology type two. Clips 130 from topology types one and three can contribute topology relevancy scores $T_1$ and $T_3$, respectively. Each clip 130 from topology type two can contribute topology relevancy scores $T_{2a}$, $T_{2b}$, $T_{2c}$. Where the first clip added to projected sample plan 234 (FIG. 3) from topology type two contributes topology relevancy score $T_{2a}$, successive topology relevancy score $T_{2b}$ can be less than topology relevancy score $T_{2a}$. Further, the next successive topology relevancy score $T_{2c}$ can be less than both $T_{2a}$ and $T_{2b}$.

Second Example

Printing Difficulty (Processes P5-5 Through P5-8)

Returning to FIGS. 3 and 5, a second example relevancy criterion can include the printing difficulty of each clip 130 in projected sample plan 234. As a relevancy criterion, the printing difficulty can numerically illustrate the relative difficulty of printing each clip 130 in IC layout 100 relative to other clips. Two factors, layout dependent effects and critical dimension, can contribute to the printing difficulty of each clip 130. The critical dimension and layout dependent effects for candidate clip 232, relative to other clips 130, can be represented numerically as the printing difficulty for candidate clip 232. In process P5-4 modules 240 can calculate the printing difficulty of each clip 130 of plurality of clips 230. The printing difficulty can be calculated, e.g., by subtracting the average value, maximum value, or minimum value of a critical dimension or area of a layout dependent effect from the critical dimension or area of a layout dependent effect for a particular clip. Modules 240 of relevancy scoring system 220 can then calculate the square root of the difference to disregard whether a particular clip is above or below the average value, maximum value, etc. In embodiments, modules 240 can combine multiple printing difficulty values, relative to respective quantities (average critical dimension, maximum critical dimension, minimum critical dimension etc.), into a single representative printing difficulty.

A user may prefer for sample plan 110 to include, in accurate proportion, clips 130 of IC layout 100 which illustrate the range of printing difficulties throughout IC layout 100. In process P5-5, modules 240 of relevancy scoring system 220 can define printing difficulty groups, e.g., by determining the critical dimension and layout dependent effects of each clip 130, ranking each clip 130 from highest difficulty to lowest difficulty, and dividing the ranked clips into sub-groups based on the number of desired groups, threshold difficulty values, etc. Based on the number of printing difficulty groups, a calculator of modules 240 in process P5-6 can assign difficulty score(s) to each group of printing difficulties and/or clips 130 therein. In an example embodiment, the scores assigned to each group of printing difficulties can be relative to the number of clips from each printing difficulty included in sample plan 110 and/or projected sample plan 234, i.e., the first clip added from a given difficulty order may receive a score of 0.07, while the next clip added from a given diffraction order may receive a score of 0.02, etc. In some situations, a user may desire for sample plan 110 to include more clips 130 of higher difficulty groups than clips 130 of lower difficulty groups. Modules 240 of relevancy scoring system in process P5-7 can apply one or more "scaling factors" to each clip 130 in a group of clips with higher printing difficulties relative to the other groups. The scaling factors applied in process P5-7 can in the form of multipliers to the difficulty scores assigned in process P5-6. For example, the scaling factors can increase the relevancy of clips 130 in higher difficulty groups by multiplying the relevant scores from higher difficulty groups by greater factors than clips from lower difficulty groups. Referring to the example of FIG. 2, the diminishing contribution to relevancy score from each successive candidate clip 234 can illustrate clips from printing difficulty groups with higher scaling factors added to sample plan 110 before clips from printing difficulty groups with lower scaling factors being added to sample plan 110 in later iterations of the process steps discussed herein.

In some implementations, it may be desirable to apply scaling factors to each clip 130 in plurality of clips 230 according to the distribution of printing difficulties in IC layout 100. For example, using a permuted list of most difficulty printing difficulties may reduce the contribution to relevancy of sample plan 110 from clips 130 which correspond to more frequent printing difficulty groups. For the distribution of clips 130 in sample plan 110 to more closely resemble the distribution of printing difficulties in IC layout 100, modules 240 of relevancy scoring system 220 can assign each clip 130 of plurality of clips 230 a scaling factor based on the distribution of printing difficulties throughout IC layout 100 in process P5-7. The probability weights can be assigned to each clip 130 based on a distribution of printing difficulties for the IC layout 100 from which clips 130 originate, or the distribution of printing difficulties in other IC layouts 100 and/or sample plans 110.

In the example provided in FIG. 2, the changing relevancy score functions for sample plans 110 after the first and second transition points may represent a situation where clips 130 included in sample plan 110 cover most or all of the difficulty groups defined in process P5-6. In this manner, the relevancy of clip 130 and/or candidate clip 234 can be quantified based on whether other clips 130 in projected sample plan 234 are obtained from a diverse group of printing difficulties and/or higher difficulty groups. Relevancy scoring system 220 can use printing difficulty as the sole relevancy criterion for each candidate clip 232 and projected sample plan 234, or can use printing difficulties in conjunction with other relevancy criteria discussed herein.

Figure 7:
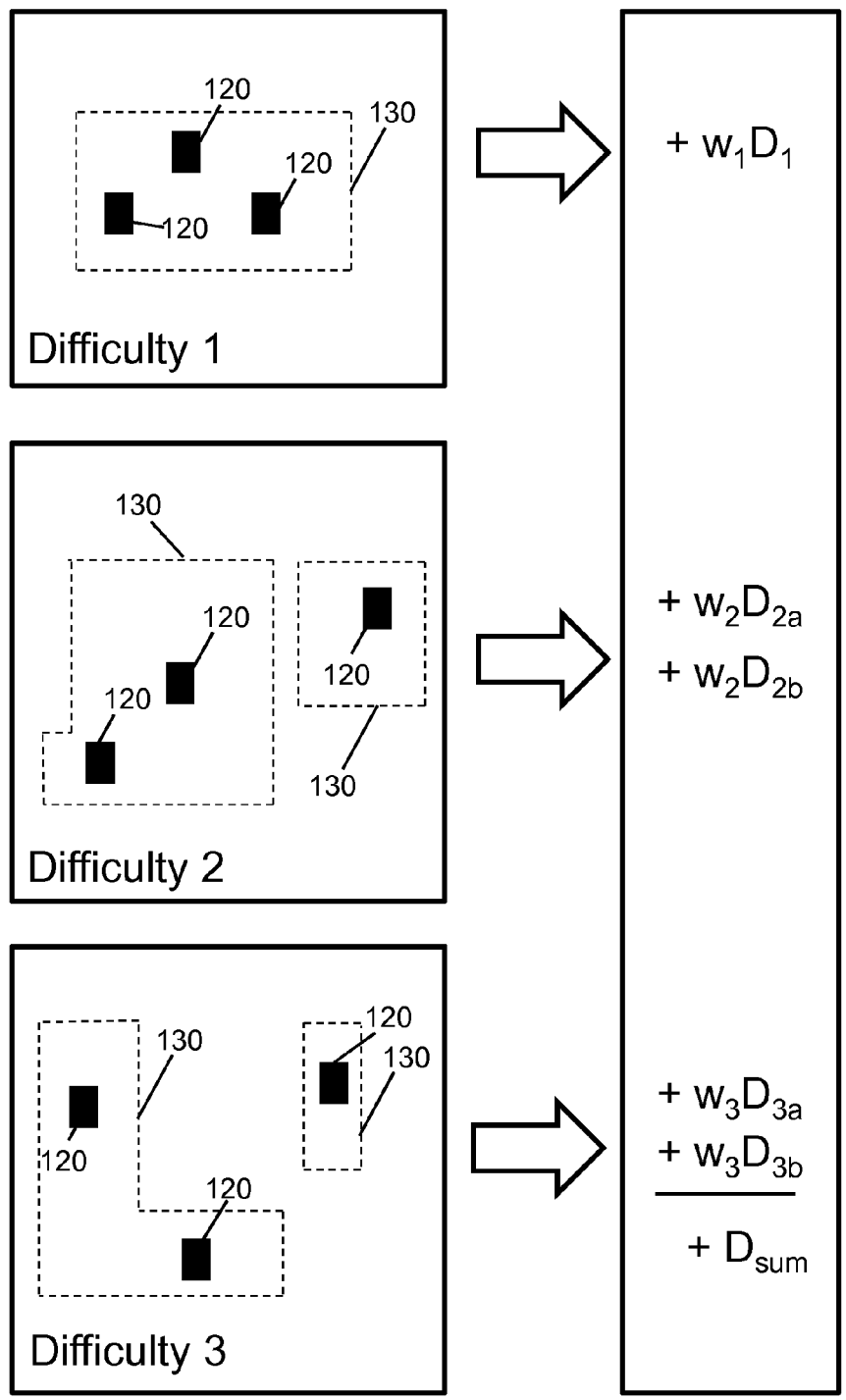
FIG. 7 provides a schematic diagram for calculating a relevancy score based on printing difficulty.

Referring briefly to FIG. 7, a schematic diagram for calculating relevancy score(s) based on printing difficulty is shown. In the example of FIG. 7, multiple clips 130 are divided into three printing difficulty groups based on, e.g., the critical dimension(s) and LDE(s) of each clip 130. Although each printing difficulty group can include any conceivable number of clips 130, the example of FIG. 7 shows one clip 130 in printing difficulty group one, while two clips 130 are included printing difficulty groups two and three. Each printing difficulty group can be assigned to a corresponding relevancy weight, $w_1$, $w_2$, $w_3$. For example, where printing difficulty group three includes the most difficult clips 130 for printing, w3 can be greater than $w_1$ and $w_2$. Clip 130 from printing difficulty group 1 one and three can contribute difficulty relevancy score $D_1$. Each clip 130 from difficulty groups two and three can contribute difficulty relevancy scores $D_{2a}$, $D_{2b}$, $D_{3a}$, $D_{3b}$. Where the first clip added to projected sample plan 234 (FIG. 3) from printing difficulty groups two and three contribute difficulty relevancy scores $D_{2a}$, $D_{3a}$, successive difficulty relevancy scores $D_{2b}$, $D_{3b}$, can be less than difficulty relevancy scores $D_{2a}$, $D_{3a}$. Each additional difficulty relevancy score from another clip 130 in the same difficulty relevancy group can be less than the difficulty relevancy score for previous clips added to projected sample plan 234.

Figure 8:
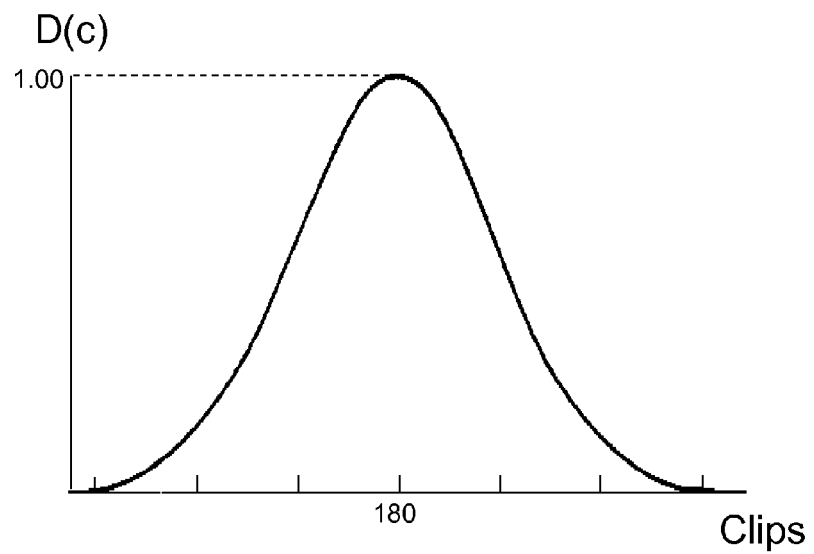
FIG. 8 provides a schematic diagram for weighting printing difficulties based on their distribution.
Figure 8:
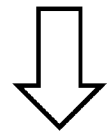

Referring now to FIG. 8, a schematic diagram for applying scaling factors to the relevancy score for projected sample plan 234 (FIG. 3) based on a distribution of printing difficulties is shown. In the example of FIG. 8, each printing difficulty group of sample plan 110 (FIGS. 1, 3) can be assigned a probability score between zero and one. Modules 240 (FIG. 3) of relevancy scoring system 220 can then multiply the scaling factor for each printing difficulty group by the contribution to relevancy score by each clip 130 in projected sample plan 234 ($w(D_1)$, $w(D_2)$, ... $w(D_n)$) to calculate a relevancy score D based on the printing difficulty of each clip and the distribution of printing difficulty groups. Although a normal distribution (i.e., bell curve) is shown in FIG. 8, it is understood that each printing difficulty group can be distributed according to any conceivable probability distribution.

Third Example

Dimensional Ratio (Processes P5-9 Through P5-11)

Returning to FIGS. 3 and 5 together, a third type of relevancy criterion can include the dimensional ratio between candidate clip 232 and/or other clips 130 in projected sample plan 234, and/or the dimensional ratio between clips 130 in projected sample plan 234 and clips 130 in another sample plan 110. The dimensional ratio, as a relevancy criterion, can be based on the contents of sample plan 110 and/or projected sample plan 234. Design requirements may specify a desired ratio of dimensions between clips 130 within IC layout 100, e.g., ratios between one-dimensional ("1D") horizontal, 1D vertical, two-dimensional ("2D") horizontal, and 2D vertical clips. At process P5-8, modules 240 of relevancy scoring system 220 can obtain the ideal (i.e., referenced) dimensional ratio for sample plan 110. The ideal dimensional ratio for sample plan 110, in some instances, may be particular dimensional ratios between clips 130 of different IC layouts 100. In other instances, the ideal dimensional ratio may be obtained from empirical data, such as dimensional ratios present in past implementations. In any event, modules 240 of relevancy scoring system 220 can calculate the dimensional ratio for projected sample plan 234 in process P5-9. Modules 240 of relevancy scoring system 220 can calculate one or more dimensional ratios for projected sample plan 234 by dividing the number of clips in one category (i.e., 1D horizontal, 1D vertical, 2D horizontal, etc.) by the number of clips in another category.

At process P5-10, modules 240 of relevancy scoring system 220 can calculate a contribution to the relevancy score of projected sample plan 234 from its dimensional ratio(s). In an embodiment, modules 240 of relevancy scoring system 220 can compare the calculated dimensional ratios for projected sample plan 234 with the ideal dimensional ratio(s) for sample plan 110 obtained in process P5-8. The amount of difference between the calculated dimensional ratio(s) for projected sample plan 234 and the ideal dimensional ratio(s) for sample plan 110 can correspond to particular relevancy scores. The addition to relevancy score from dimensional ratios can be inversely proportional to the ideal dimensional ratio(s) obtained in process P5-8 and the dimensional ratios for projected sample plan 234 calculated in process P5-9. To determine the difference between the ideal dimensional ratio(s) and the calculated dimensional ratio(s) in absolute terms, modules 240 of relevancy scoring system 220 can perform a scaling operation on calculated difference(s), such as applying a root mean square operation. Relevancy scoring system 220 can use dimensional ratios as the sole relevancy criterion for each candidate clip 232 and projected sample plan 234, or can use dimensional ratios in conjunction with other relevancy criteria discussed herein. In the example of FIG. 2, the changing relevancy score functions for sample plans 110 after the first and second transition points represent a situation where successive projected sample plans 234 have dimensional ratios which become closer to ideal values. In this situation, adding successive clips 130 to projected sample plan 234 may have the same effect on the difference between the dimensional ratio(s) of projected sample plan 234 relative to a referenced sample plan 110.

Figure 9:
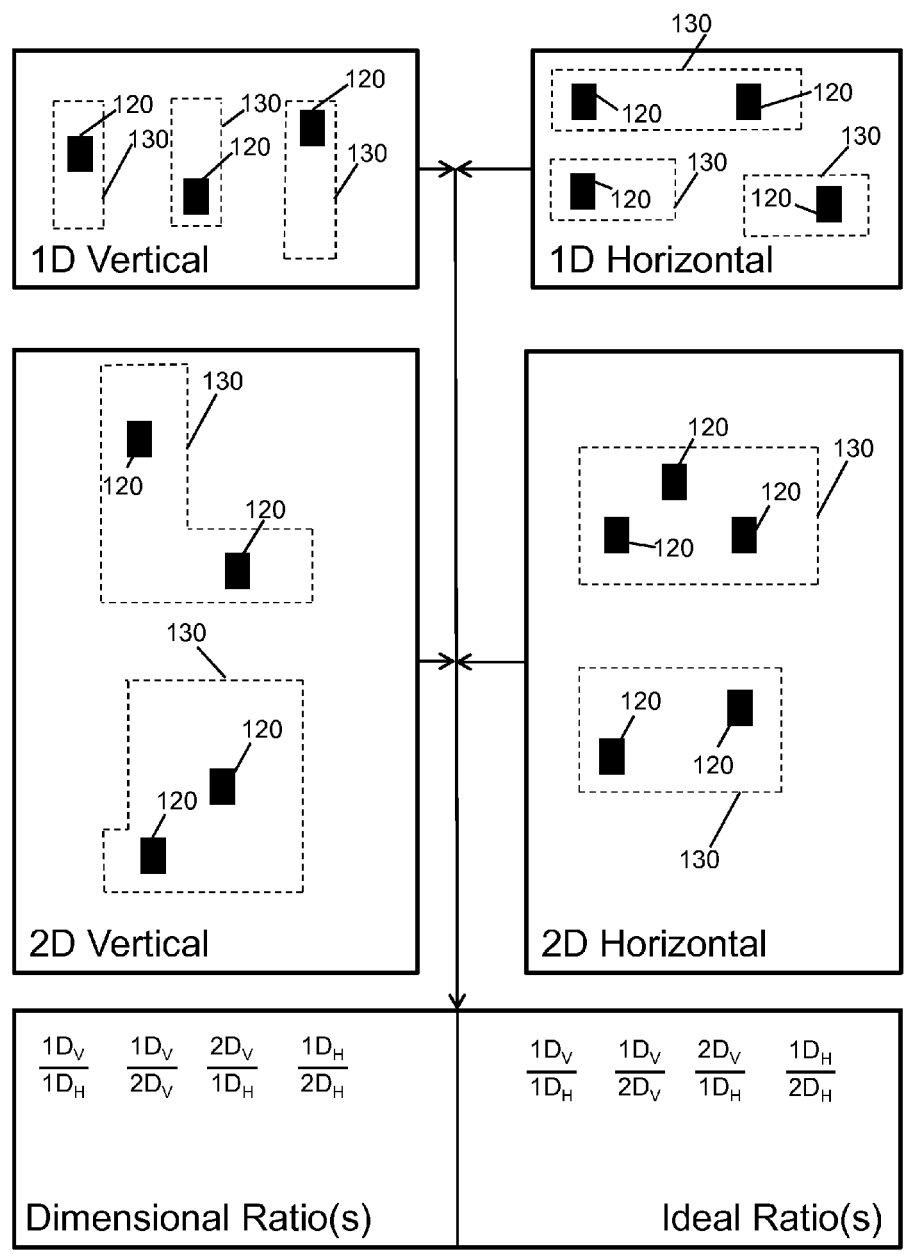
FIG. 9 provides a schematic diagram for calculating a relevancy score based on dimensional ratios.

Referring briefly to FIG. 9, a schematic diagram for calculating the relevancy score for projected sample plan 234 (FIG. 3) based on dimensional ratio(s) is shown. Each clip 130 included in projected sample plan 234 and/or other sample plans 110 can be divided into 1D horizontal, 1D vertical, 2D vertical, and 2D horizontal clips 130 based on their dimensions (e.g., lengths, widths), and other attributes such as whether clip 130 has a greater horizontal dimension than its vertical dimension or vice versa. Relevancy scoring system 220 (FIG. 3) can count the number of clips in each group and calculate dimensional ratios by dividing the number of clips 130 in one group by the number of clips 130 in another group. Modules 240 (FIG. 3) of relevancy scoring system 220 can then compare the calculated dimensional ratios with ideal dimensional ratios to determine a relevancy score for projected sample plan 234 based on the difference between the calculated and ideal values.

Conversion from Relevancy Criteria to Relevancy Score (Processes P5-11 Through P5-14)

Returning to FIGS. 3 and 5 together, processes for converting the scores for each relevancy criteria discussed herein to a total relevancy score are discussed. Regardless of which relevancy criterion or criteria relevancy scoring system 220 uses to calculate relevancy scores, the various contributed criteria can be further processed and scaled before relevancy scoring system 220 determines whether to add candidate clip 232 to sample plan 110. In process P5-11, modules 240 of relevancy scoring system 220 can multiply the relevancy score from one or more applicable relevancy criteria by a corresponding relevancy weight. For example, where the contribution to relevancy scores from topology type (i.e., from process P5-3) and dimensional ratios (i.e., from process P5-10) carry different orders of magnitude, one of these relevancy criteria can be multiplied by a relevancy weight which brings each contribution to relevancy score to the same order of magnitude (e.g., a multiplier of one hundred, one thousand, one million, etc.). In other situations, the topology type of each clip 130 in projected sample plan 234 may be of greater relevance than other criteria, such as printing difficulty. Here, the relevancy weight for topology type in this situation can be arbitrarily set to a multiplying factor which emphasizes the contribution to relevancy score from topology type over other attributes. Where no relevancy weights are desired, the contribution to relevancy score from each criterion can simply be multiplied by a relevancy weight of one, or relevancy scoring system 220 can bypass process P5-11 altogether. It is also understood that a user may define and/or modify the relevancy weights applied in process P5-11 to suit particular applications.

In process P5-12, modules 240 of relevancy scoring system 220 can compute the total relevancy score for projected sample plan 234 based on one or more of the criteria discussed herein. More specifically, modules 240 can compute the arithmetic sum for the contribution of each relevancy criterion, with each contribution being the product of a score for the relevancy criterion (e.g., calculated or assigned in processes P5-3, P5-6, P5-10, and/or P5-12) and their corresponding relevancy weights. The calculated total relevancy score can illustrate the relevancy score of projected sample plan 234 with candidate clip 232 therein, in addition to any other clips 130 previously added to sample plan 110 and represented in projected sample plan 234.

In process P5-13, modules 240 of relevancy scoring system 220 can multiply the total relevancy score calculated in process P-12 by a scaling factor. The scaling factor can be a further multiplier for, e.g., bringing the value of the total relevancy score closer to the value or order of magnitude of a total relevancy score for a different projected sample plan 234, sample plans 110 for other IC layouts, etc.

It is understood that the method illustrated in FIG. 4 and further detailed in FIG. 5 can each correspond to several successive implementations, e.g., in which successive projected sample plans 234 are created with successive candidate clips 232 therein. Thus, the total relevancy score calculated in process P5 can be one of many total relevancy scores each corresponding to an earlier created sample plan 110 for the same IC layout 100. To mitigate the effects of bias on the calculated total relevancy scores, a calculator of modules 240 of relevancy scoring system 220 can calculate set relevancy score of the first projected sample plan, with candidate clips 232 thereof providing the greatest contribution to total relevancy score, as being equal to one. Modules 240 can then scale (e.g., through multiplication by fractions of one) the value of the total relevancy score calculated in process P5-12 to normalize the resulting relevancy score(s) in process P-14. These processes can generally be described as mathematical normalization, and among other benefits can allow the relevancy score for candidate clip 232 to be calculated in terms of a normalized value, and for the relevancy score functions calculated in process P7 to also be expressed as a mathematically normalized value. In the example of FIG. 2, projected sample plan 234 with only one clip thereon can have a total relevancy score of one, with each successive projected sample plan contributing a relevancy score of less than one, in successively lesser amounts.

Methods according to the present disclosure can calibrate OPC for one or more IC layouts 100 by creating sample plan 110 with a minimal number of clips 130 therein. Modules 240, following the various processes described herein, can generate an OPC model which includes sample plan 110 with the minimal number of clips. Where applicable, fabricator 250 can fabricate one or more ICs which include IC layout 100 using the OPC model with sample plan 110 therein. Thus, embodiments of the present disclosure can fabricate one or more ICs after automatically creating sample plan 110 with a minimal number of clips and generating an OPC model with sample plan 110 included.

Technical effects of the present disclosure can include, without limitation, the ability to automatically select a minimal number of clips 130 to include in sample plan 110 which adequately represent the attributes of IC layout 100. In addition, technical effects of the present disclosure include automatically generating sample plans 110 which include fewer than all clips 130 of IC layout 100, and thus provide a set of empirical data which increases the speed of OPC processes performed for particular IC layouts 100. Embodiments of the present disclosure can thus reduce the need for a review of sample plan by human users, thereby increasing the pace at which any irregularities and distortions within an IC layout can be corrected automatically. Furthermore, embodiments of the present disclosure automatically select a minimal number of clips 130 to include in sample plan 110 by identifying a transition point where the a relevancy score function for successive clips 130 added to sample plan 110 changes from a non-linear (e.g., exponential with diminishing returns) to a linear score function (e.g., each successive clip contributes the same amount to total relevancy score).

Alternative Embodiments and Implementations

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be used. A computer readable storage medium may be, for example, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As used herein, the term "configured," "configured to" and/or "configured for" can refer to specific-purpose features of the component so described. For example, a system or device configured to perform a function can include a computer system or computing device programmed or otherwise modified to perform that specific function. In other cases, program code stored on a computer-readable medium (e.g., storage medium), can be configured to cause at least one computing device to perform functions when that program code is executed on that computing device. In these cases, the arrangement of the program code triggers specific functions in the computing device upon execution. In other examples, a device configured to interact with and/or act upon other components can be specifically shaped and/or designed to effectively interact with and/or act upon those components. In some such circumstances, the device is configured to interact with another component because at least a portion of its shape complements at least a portion of the shape of that other component. In some circumstances, at least a portion of the device is sized to interact with at least a portion of that other component. The physical relationship (e.g., complementary, size-coincident, etc.) between the device and the other component can aid in performing a function, for example, displacement of one or more of the device or other component, engagement of one or more of the device or other component, etc.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method for automatically creating a target sample plan for optical proximity correction (OPC) calibration with a minimal number of clips, the method comprising using a computing device to perform actions including:

defining a sample plan including a plurality of clips, each of the plurality of clips representing portions of an integrated circuit (IC) layout;

calculating a total relevancy score of a projected sample plan for the IC layout, wherein the projected sample plan includes a candidate clip representing an additional portion of the IC layout, and wherein the relevancy score is derived from at least one relevancy criterion and a relevancy weight for the at least one relevancy criterion, the at least one relevancy criterion being one of a topology type of a clip, a printing difficulty of a clip, and a dimensional ratio between clips in the projected sample plan;

calculating a relevancy score difference between the total relevancy score of the projected sample plan and a total relevancy score of the sample plan without the candidate clip;

adding the candidate clip to the sample plan for the IC layout and removing the candidate clip from the plurality of clips in response to the relevancy score difference substantially fitting a non-linear relevancy score function;

removing the candidate clip from the plurality of clips without adding the clip to the sample plan for the IC layout in response to the relevancy score difference substantially fitting a linear relevancy score function, wherein the candidate clip not being added to the sample plan indicates that the sample plan includes the minimal number of clips; and generating an OPC model using the sample plan with the minimal number of clips, wherein the sample plan with the minimal number of clips represents the target sample plan, and wherein the OPC model is used to manufacture at least one IC.

2. The method of claim 1, wherein in the case that the at least one relevancy criterion includes the topology type, the calculating of the total relevancy score of the projected sample plan further includes:

calculating a polygon count for the IC layout, wherein the polygon count includes a total number of shapes for each clip; and calculating an area density for the IC layout, wherein the area density includes a percentage of area in the projected sample plan occupied by polygons in each clip.

3. The method of claim 2, further comprising grouping each of the plurality of clips into one of a plurality of similarity groups, wherein each group corresponds to a range of polygon counts and area densities.

4. The method of claim 3, further comprising:

determining a diffraction order coefficient for each clip; and clustering each of the plurality of clips within each similarity group into one of a plurality of diffraction clusters, wherein each diffraction cluster corresponds to a range of diffraction order coefficients.

5. The method of claim 1, wherein in the case that the at least one relevancy criterion includes the printing difficulty, the plurality of clips includes a highest printing difficulty clip and a lowest printing difficulty clip, and the printing difficulty is calculated based on a critical dimension or a lithography difficulty estimator (LDE) of the clip.

6. The method of claim 5, further comprising multiplying the relevancy score for each of the plurality of clips by a respective scaling factor, wherein the scaling factor is based on the printing difficulty of the corresponding clip or a probability distribution of printing difficulties.

7. The method of claim 1, wherein in the case that the at least one relevancy criterion includes the dimensional ratio, the dimensional ratio represents a quotient of features for one the plurality of clips over another clip of the plurality of clips, the features being one of horizontal one-dimensional features, vertical one-dimensional features, horizontal two-dimensional features, and vertical two-dimensional features.

8. The method of claim 1, wherein the total relevancy score comprises one of a plurality of total relevancy scores corresponding to each of a plurality of sample plans, and further comprising setting the total relevancy score of a first created projected sample plan as being equal to one, and mathematically normalizing each of the other total relevancy scores relative to the first created projected sample plan.

9. The method of claim 1, further comprising defining at least one critical clip from the plurality of clips, adding the at least one critical clip to the sample plan and the projected sample plan, and removing the at least one critical clip from the plurality of clips before defining the sample plan with the plurality of clips therein.

10. A program product stored on a non-transitory computer readable storage medium, the program product operative to automatically create a target sample plan for optical proximity correction (OPC) calibration with a minimal number of clips when executed, the non-transitory computer readable storage medium comprising program code for:

defining a sample plan including a plurality of clips, each of the plurality of clips representing portions of an integrated circuit (IC) layout;

calculating a total relevancy score of a projected sample plan for the IC layout, wherein the projected sample plan includes a candidate clip representing an additional portion of the IC layout, and wherein the relevancy score is derived from at least one relevancy criterion and a relevancy weight for the at least one relevancy criterion, the at least one relevancy criterion being one of a topology type of a clip, a printing difficulty of a clip, and a dimensional ratio between clips in the projected sample plan;

calculating a relevancy score difference between the total relevancy score of the projected sample plan and a total relevancy score of the sample plan without the candidate clip;

adding the candidate clip to the sample plan for the IC layout and removing the candidate clip from the plurality of clips in response to the relevancy score difference substantially fitting a non-linear relevancy score function removing the candidate clip from the plurality of clips without adding the clip to the sample plan for the IC layout in response to the relevancy score difference substantially fitting a linear relevancy score function, wherein the candidate clip not being added to the sample plan indicates that the sample plan includes the minimal number of clips; and generating an OPC model using the sample plan with the minimal number of clips, wherein the sample plan with the minimal number of clips represents the target sample plan, and wherein the OPC model is used to manufacture at least one IC.

11. The program product of claim 10, wherein in the case that the at least one relevancy criterion includes the topology type, the calculating of the total relevancy score of the projected sample plan further includes:

calculating a polygon count for the IC layout, wherein the polygon count includes a total number of shapes for each clip; and calculating an area density for the IC layout, wherein the area density includes a percentage of area in the projected sample plan occupied by polygons in each clip.

12. The program product of claim 11, further comprising grouping each of the plurality of clips into one of a plurality of similarity groups, wherein each similarity group corresponds to a range of polygon counts and area densities.

13. The program product of claim 12, further comprising:

determining a diffraction order coefficient for each clip; and clustering each of the plurality of clips within each similarity group into one of a plurality of diffraction clusters, wherein each diffraction cluster corresponds to a range of diffraction order coefficients.

14. The program product of claim 10, wherein in the case that the at least one relevancy criterion includes the printing difficulty, the plurality of clips includes a highest printing difficulty clip and a lowest printing difficulty clip, and the printing difficulty is calculated based on a critical dimension or a layout lithography difficulty estimator (LDE) of the clip.

15. The program product of claim 14, further comprising multiplying the relevancy score for each of the plurality of clips by a respective scaling factor, wherein the scaling factor is based on the printing difficulty of the corresponding clip or a probability distribution of printing difficulties.

16. The program product of claim 10, wherein in the case that the at least one relevancy criterion includes the dimensional ratio, the dimensional ratio represents a quotient of features for one the plurality of clips over another clip of the plurality of clips, the features being one of horizontal one-dimensional features, vertical one-dimensional features, horizontal two-dimensional features, and vertical two-dimensional features.

17. The program product of claim 10, wherein the total relevancy score comprises one of a plurality of total relevancy scores corresponding to each of a plurality of sample plans, and further comprising setting the total relevancy score of a first created projected sample plan as being equal to one, and mathematically normalizing each of the other total relevancy scores relative to the first created projected sample plan before calculating relevancy score for the candidate clip.

18. The program product of claim 10, further comprising defining at least one critical clip from the plurality of clips, adding the at least one critical clip to the sample plan and the projected sample plan, and removing the at least one critical clip from the plurality of clips before defining the sample plan with the plurality of clips therein.

19. A system for automatically creating a sample plan for optical proximity correction (OPC) calibration with a minimal number of clips, the system comprising:
 a computing device configured to perform actions including:
  defining a sample plan including a plurality of clips, each of the plurality of clips representing portions of an integrated circuit (IC) layout,
  calculating a total relevancy score of a projected sample plan for the IC layout, wherein the projected sample plan includes a candidate clip representing an additional portion of the IC layout, and wherein the relevancy score is derived from at least one relevancy criterion and a relevancy weight for the at least one relevancy criterion, the at least one relevancy criterion being one of a topology type of a clip, a printing difficulty of a clip, and a dimensional ratio between clips in the projected sample plan,
  adding the candidate clip to the sample plan for the IC layout and removing the candidate clip from the plurality of clips in response to the relevancy score difference substantially fitting a non-linear relevancy score function, and
  removing the candidate clip from the plurality of clips without adding the clip to the sample plan for the IC layout in response to the relevancy score difference substantially fitting a linear relevancy score function, wherein the candidate clip not being added to the sample plan indicates that the sample plan includes the minimal number of clips; and
 an OPC modeling device for generating an OPC model using the sample plan with the minimal number of clips, wherein the sample plan with the minimal number of clips represents the target sample plan, and wherein the OPC model is used to manufacture at least one IC.

20. The system of claim 19, wherein in the case that the at least one relevancy criterion includes the topology type, the calculating of the total relevancy score of the projected sample plan further includes:
 calculating a polygon count for the IC layout, wherein the polygon count includes a total number of shapes for each clip;
 calculating an area density for the IC layout, wherein the area density includes a percentage of area in the projected sample plan occupied by polygons in each clip; and
 grouping each of the plurality of clips into one of a plurality of similarity groups, wherein each similarity group corresponds to a range of polygon counts and area densities.

* * * * *